(12) United States Patent
Ando et al.

(10) Patent No.: US 12,477,632 B2
(45) Date of Patent: Nov. 18, 2025

(54) LIGHT-EMITTING DEVICE

(71) Applicant: Murata Manufacturing Co., Ltd., Kyoto (JP)

(72) Inventors: Shota Ando, Kyoto (JP); Takahiro Matsuoka, Kyoto (JP); Tatsuya Ohara, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 177 days.

(21) Appl. No.: 18/361,230

(22) Filed: Jul. 28, 2023

(65) Prior Publication Data
US 2023/0371146 A1 Nov. 16, 2023

Related U.S. Application Data (63) Continuation of application No. PCT/JP2022/002088, filed on Jan. 21, 2022.

(30) Foreign Application Priority Data

Jan. 29, 2021 (JP) .................. 2021-013468

(51) Int. Cl.
*H05B 45/30* (2020.01)
*H05B 45/325* (2020.01)
(Continued)

(52) U.S. Cl.
CPC .......... *H05B 45/325* (2020.01); *H05B 45/40* (2020.01); *H05B 47/16* (2020.01)

(58) Field of Classification Search
CPC ...... H05B 45/30; H05B 45/32; H05B 45/325; H05B 45/40; H05B 47/10; H05B 47/16;
(Continued)

(56) References Cited

U.S. PATENT DOCUMENTS

2002/0181533 A1  12/2002  Vail et al.
2021/0028158 A1   1/2021  Takimoto et al.
(Continued)

FOREIGN PATENT DOCUMENTS

| JP | 2018-019044 A | 2/2018 |
|---|---|---|
| JP | 2020-126979 A | 8/2020 |
| WO | 2019/207938 A1 | 10/2019 |

OTHER PUBLICATIONS

International Search Report for PCT/JP2022/002088 dated Mar. 1, 2022.

*Primary Examiner* — Long Nguyen
(74) *Attorney, Agent, or Firm* — McDonald Hopkins LLC (57) ABSTRACT

The light-emitting device includes a solid-state light-emitting element, driving capacitors and a switching element which are formed on/in a substrate. When the switching element is turned on, the switching element forms a driving current loop for discharging charged electric charges of the driving capacitors to the solid-state light-emitting element. The driving capacitors are configured to store a driving electric charge for the solid-state light-emitting element and are connected in parallel. Each of the capacitors, the solid-state light-emitting element, and the switching element form a plurality of driving current loops. The capacitances of the capacitors are substantially equal, and the capacitors are formed at substantially equidistant positions from the solid-state light-emitting element.

9 Claims, 8 Drawing Sheets

(51) Int. Cl.
*H05B 45/40* (2020.01)
*H05B 47/16* (2020.01)

(58) Field of Classification Search
CPC .. H01S 5/0239; H01S 5/02345; H01S 5/0428; H01G 4/40
See application file for complete search history.

(56) References Cited

U.S. PATENT DOCUMENTS

2021/0265813 A1* 8/2021 Iguchi .................. G01S 7/4815
2021/0293966 A1 9/2021 Sakai et al.
2021/0325034 A1* 10/2021 Sakai ...................... G06F 1/189

* cited by examiner

LIGHT-EMITTING DEVICE

CROSS REFERENCE TO RELATED APPLICATION

This is a continuation of International Application No. PCT/JP2022/002088 filed on Jan. 21, 2022 which claims priority from Japanese Patent Application No. 2021-013468 filed on Jan. 29, 2021. The contents of these applications are incorporated herein by reference in their entireties.

BACKGROUND ART

Technical Field

The present disclosure relates to light-emitting devices configured to drive a solid-state light-emitting element, such as a laser diode, and, more particularly, to a light-emitting device that effectively achieves emission of short-pulse high-peak light.

Figure 12A:
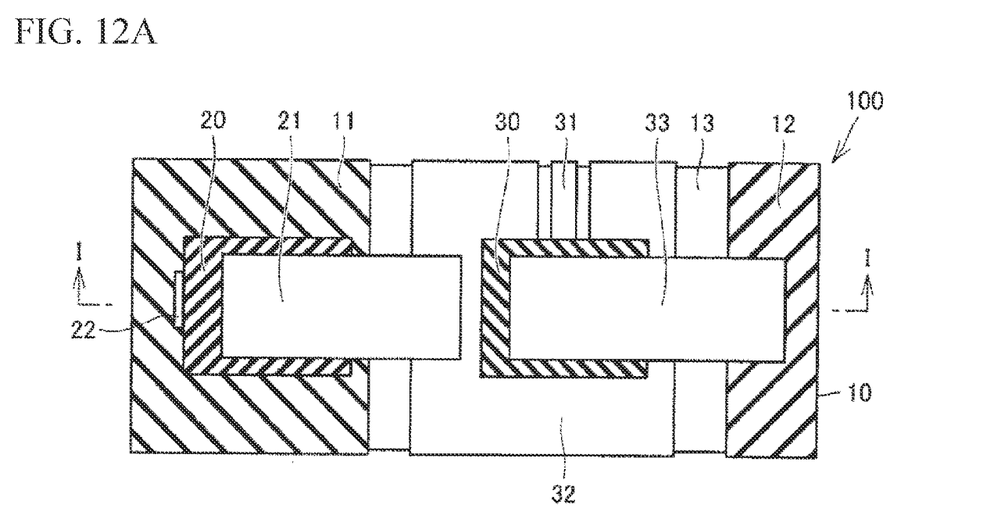
FIG. 12A is a plan view of a light-emitting device 100 disclosed in Patent Document 1.
Figure 12B:
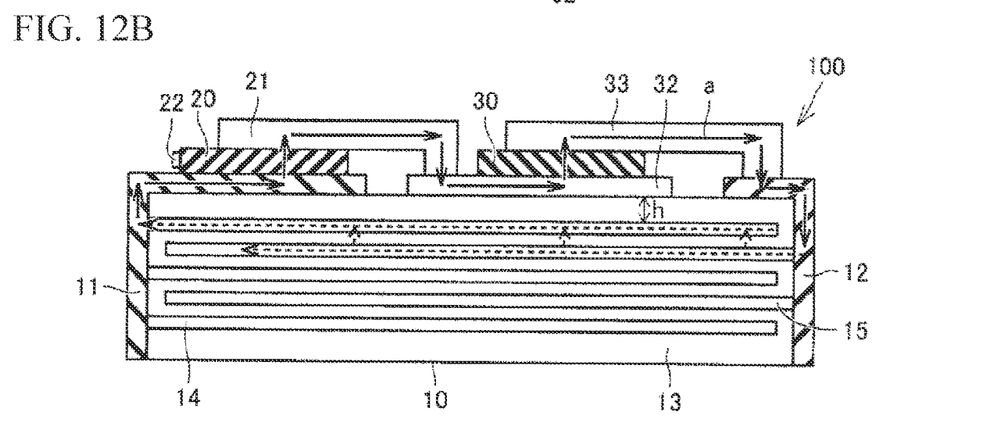
FIG. 12B is a sectional view taken along line I-I in FIG. 12A.
Figure 13:
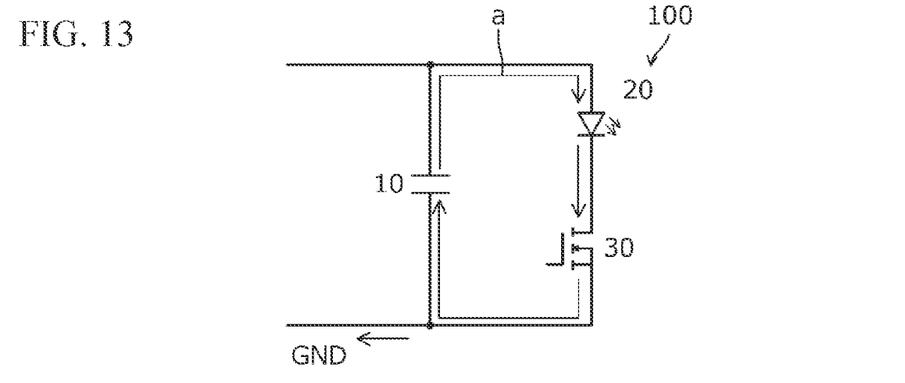
FIG. 13 is a circuit diagram of the light-emitting device 100.

FIG. 12A is a plan view of a light-emitting device 100 disclosed in Patent Document 1, and FIG. 12B is a sectional view taken along line I-I in FIG. 12A. FIG. 13 is a circuit diagram of the light-emitting device 100.

The light-emitting device 100 disclosed in Patent Document 1 includes a capacitor 10, a solid-state light-emitting element 20 for emitting light in response to supply of power from the capacitor 10, and a semiconductor switching element 30 for controlling supply of power from the capacitor 10 to the solid-state light-emitting element 20. The solid-state light-emitting element 20 is placed on the outer surface of the capacitor 10. The semiconductor switching element 30 is provided on the outer surface of the capacitor 10 or inside the capacitor 10. Between outer electrodes 11 and 12, a connecting electrode 32 is provided which connects the solid-state light-emitting element 20 and the semiconductor switching element 30 in series. The capacitor 10 is formed of inner electrodes 14 and 15 formed in a dielectric ceramic layer 13. A gate extended electrode 31 and wiring lines 21 and 33 are formed on the upper surface of the light-emitting device 100. A light-emitting unit 22 is provided in the side portion of the solid-state light-emitting element 20.

By mounting the solid-state light-emitting element 20 and the semiconductor switching element 30 on the capacitor 10 as above, a closed loop connecting the semiconductor switching element 30, the solid-state light-emitting element 20, and the capacitor 10 becomes short. As a result, the parasitic impedance of the closed loop that is a current path is reduced, and high-peak short-pulse light is emitted.
Patent Document 1: International Publication No. 2019/207938

BRIEF SUMMARY

In the light-emitting device described in Patent Document 1, only a single current path (the closed loop connecting the semiconductor switching element 30, the solid-state light-emitting element 20, and the capacitor 10) is provided for the solid-state light-emitting element 20 as illustrated in FIG. 13. Accordingly, a parasitic impedance is high, and high-peak short-pulse light cannot be effectively emitted.

By increasing an input voltage (a charging voltage for the capacitor 10 in FIG. 13), the above emitted light power can be increased. However, if a boosting circuit is added for the increase in the input voltage, this leads to a complicated circuit, the increase in the number of components, and the increase in cost. Since the pulse width of emitted light becomes wide because of the application of a high voltage, this becomes a problem for the application purpose for which a short pulse width and a high instantaneous peak are needed.

The present disclosure provides a light-emitting device that effectively achieves emission of short-pulse high-peak light.

A light-emitting device that is an example of the present disclosure includes a solid-state light-emitting element, a driving capacitor, and a switching element which are formed or mounted on/in a substrate. When the switching element is turned on, the switching element forms a driving current loop for discharging a charged electric charge of the driving capacitor to the solid-state light-emitting element. The driving capacitor includes a plurality of capacitors that are configured to store a driving electric charge for the solid-state light-emitting element and that are connected in parallel. Each of the plurality of capacitors, the solid-state light-emitting element, and the switching element form a plurality of driving current loops. Time constants of a plurality of discharge paths formed by the plurality of capacitors and the plurality of driving current loops coincide.

With the above configuration in which each of the plurality of capacitors, the solid-state light-emitting element, and the switching element form the plurality of driving current loops, the combined impedance of parasitic impedances of a plurality of closed loops that are current paths is reduced. Accordingly, the time constants of the plurality of discharge paths formed by the plurality of capacitors and the plurality of driving current loops become small.

According to the present disclosure, a light-emitting device is configured which achieves emission of short-pulse high-peak light.

BRIEF DESCRIPTION OF THE DRAWINGS

FIG. 4 is a waveform diagram of a driving current (the drain current of a switching element Q1) that flows through a solid-state light-emitting element LD1 when the switching element Q1 is turned on.

DETAILED DESCRIPTION

A plurality of embodiments for carrying out the present disclosure will be described below by giving some concrete examples with reference to the drawings. The same parts are denoted by the same reference symbols in the drawings. While the embodiments are described separately for the sake of convenience of explanation in consideration of ease of explanation and understanding of key points, configurations described in the different embodiments can be partly replaced or combined. In the second and subsequent embodiments, descriptions of matters common to those in the first embodiment will be omitted and only different points will be described. In particular, descriptions of similar operational effects obtained with similar configurations will not be repeated in each of the embodiments.

First Embodiment

Figure 1:
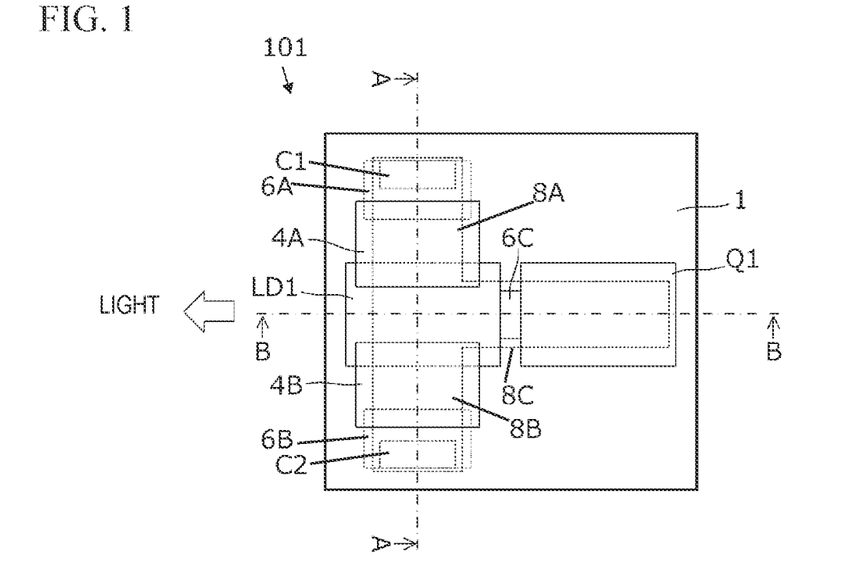
FIG. 1 is a plan view of a light-emitting device 101 according to a first embodiment.
Figure 2A:
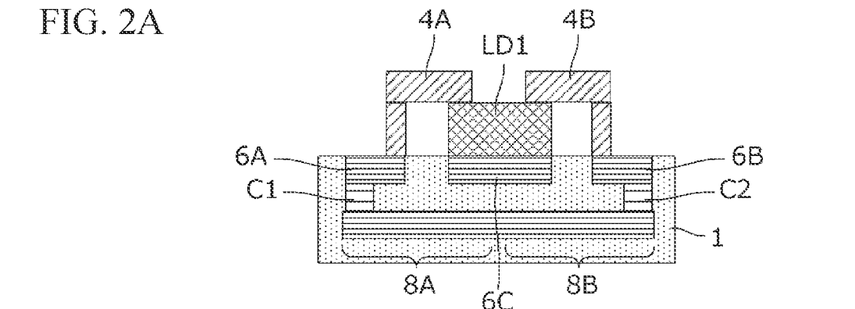
FIG. 2A is a sectional view taken along line A-A in FIG. 1.
Figure 2B:
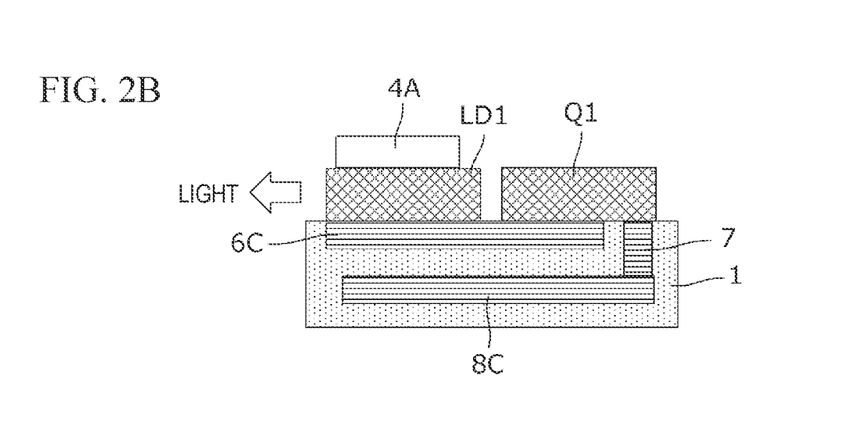
FIG. 2B is a sectional view taken along line B-B in FIG. 1.

FIG. 1 is a plan view of a light-emitting device 101 according to the first embodiment. Fig. GA is a sectional view taken along line A-A in FIG. 1, and FIG. 2B is a sectional view taken along line B-B in FIG. 1.

The light-emitting device 101 includes a solid-state light-emitting element LD1, two driving capacitors C1 and C2, and a switching element Q1 which are formed on/in a substrate 1. Referring to FIGS. 1 and 2B, a thick arrow represents a light emission direction of the solid-state light-emitting element LD1. As will be described below, when the switching element Q1 is turned on, a driving current loop for discharging the charged electric charges of the driving capacitors C1 and C2 to the solid-state light-emitting element LD1 is formed.

The driving capacitors C1 and C2 are connected in parallel to each other and store a driving electric charge for the solid-state light-emitting element LD1.

The driving capacitor C1, the solid-state light-emitting element LD1, and the switching element Q1 form a first driving current loop, and the driving capacitor C2, the solid-state light-emitting element LD1, and the switching element Q1 form a second driving current loop.

As illustrated in FIG. 1, the driving capacitors C1 and C2 are formed at respective positions not overlapping the solid-state light-emitting element LD1 and the switching element Q1 in plan view of a substrate 1. The driving capacitors C1 and C2 are substantially equivalent and are formed at substantially equidistant positions from the solid-state light-emitting element LD1.

As illustrated in FIGS. 2A and 2B, upper conductor patterns 6A and 6B are formed in the surface layer of the substrate 1 and lower conductor patterns 8A, 8B, and 8C are formed in the substrate 1. The substrate 1 is, for example, a silicon substrate. Each of the upper conductor patterns 6A and 6B and the lower conductor patterns 8A, 8B, and 8C is, for example, an Al pattern or a Cu pattern. The upper conductor patterns 6A and 6B are formed several micrometers apart from the lower conductor patterns 8A, 8B, and 8C. As illustrated in FIG. 2A, the driving capacitors C1 and C2 are provided between the lower conductor patterns 8A and 8B and the upper conductor patterns 6A and 6B. As illustrated in FIG. 2B, an interlayer connection conductor 7 is formed between the lower conductor pattern 8C and the switching element Q1. The interlayer connection conductor 7 connects one end (a source terminal to be described below) of the switching element Q1 and the lower conductor pattern 8C.

As illustrated in FIGS. 2A and 2B, an upper conductor pattern 6C is formed in the surface layer of the substrate 1. The solid-state light-emitting element LD1 is mounted on the upper conductor pattern 6C. A light-emitting element connection conductor 4A extending from the upper surface of the upper conductor pattern 6A to the upper surface of the solid-state light-emitting element LD1 and a light-emitting element connection conductor 4B extending from the upper surface of the upper conductor pattern 6B to the upper surface of the solid-state light-emitting element LD1 B are formed.

As illustrated in FIG. 2B, the other end (a drain terminal to be described below) of the switching element Q1 is connected to the upper conductor pattern 6C.

The upper conductor patterns 6A and 6B correspond to an "upper conductor pattern" according to the present disclosure, and the lower conductor patterns 8A and 8B correspond to a "lower conductor pattern" according to the present disclosure.

Figure 3A:
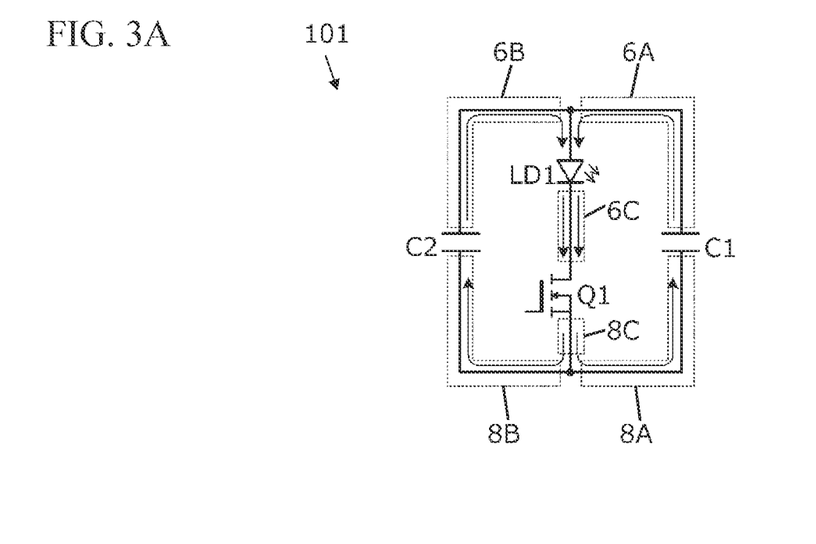
FIG. 3A is a circuit diagram of the light-emitting device 101.
Figure 3B:
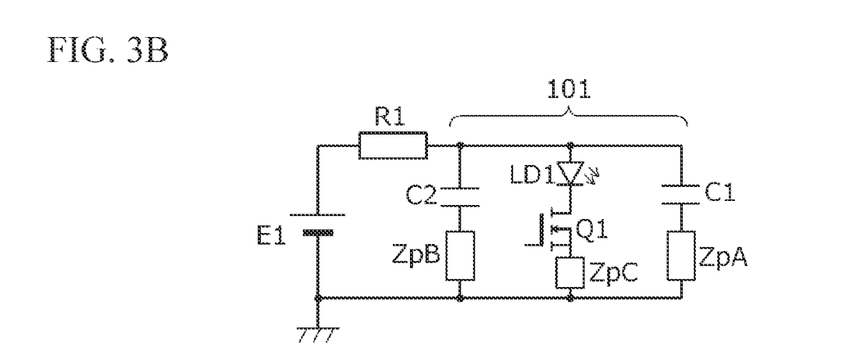
FIG. 3B is a general circuit diagram in a state in which a driving power supply is connected to the light-emitting device 101.

FIG. 3A is a circuit diagram of the light-emitting device 101. FIG. 3B is a general circuit diagram in a state in which a driving power supply is connected to the light-emitting device 101. As illustrated in FIG. 3A, the switching element Q1 is connected in series to the solid-state light-emitting element LD1 in the light-emitting device 101. In this example, the solid-state light-emitting element LD1 is a laser diode and the switching element Q1 is a MOS-FET. The driving capacitor C1 is connected in parallel to the series circuit of the solid-state light-emitting element LD1 and the switching element Q1. The driving capacitor C2 is connected in parallel to the driving capacitor C1.

Referring to FIG. 3A, when the switching element Q1 is turned on, a driving current loop for discharging the charged electric charges of the driving capacitors C1 and C2 to the solid-state light-emitting element LD1 is formed in the light-emitting device 101.

The upper conductor patterns 6A, 6B, and 6C and the lower conductor patterns 8A, 8B, and 8C have respective parasitic impedances. Referring to FIG. 3B, a parasitic impedance ZpA is a parasitic impedance formed by the upper conductor pattern 6A and the lower conductor pattern 8A. A parasitic impedance ZpB is a parasitic impedance formed by the upper conductor pattern 6B and the lower conductor pattern 8B. A parasitic impedance ZpC is a parasitic impedance formed by the upper conductor pattern 6C and the lower conductor pattern 8C.

In FIG. 3B, a constant voltage power supply E1 and a resistance element R1 inserted into a path through which a current from the constant voltage power supply E1 flows are also illustrated. When the switching element Q1 is in an OFF state, the driving capacitors C1 and C2 are charged by the constant voltage power supply E1. When the switching element Q1 is turned on, a driving current flows through a path represented by arrows in FIG. 3A.

The driving capacitors C1 and C2 are substantially equivalent and are formed at substantially equidistant positions from the solid-state light-emitting element LD1. Accordingly, as illustrated in FIG. 3A, the upper conductor pattern 6A connecting one end (anode) of the solid-state light-emitting element LD1 and one end of the driving capacitor C1 and the upper conductor pattern 6B connecting the one end (anode) of the solid-state light-emitting element LD1 and one end of the driving capacitor C2 are substantially equal in length, and the lower conductor pattern 8A connecting the other end (cathode) of the solid-state light-emitting element LD1 and the other end of the driving capacitor C1 and the lower conductor pattern 8B connecting the other end (cathode) of the solid-state light-emitting element LD1 and the other end of the driving capacitor C2 are substantially equal in length. The parasitic impedances of the upper conductor patterns 6A and 6B are therefore substantially equal, and the parasitic impedances of the lower conductor patterns 8A and 8B are therefore substantially equal. The parasitic impedances ZpA and ZpB illustrated in FIG. 3B are therefore substantially equal. The electric discharge time constant of a closed loop formed by the driving capacitor C1, the parasitic impedances ZpA and ZpC, the solid-state light-emitting element LD1, and the switching element Q1 and the electric discharge time constant of a closed loop formed by the driving capacitor C2, the parasitic impedances ZpB and ZpC, the solid-state light-emitting element LD1, and the switching element Q1 are substantially equal.

The above phrase of "the driving capacitors C1 and C2 are substantially equivalent" means that the capacitances of the driving capacitors C1 and C2 coincide within the range not causing the significant distortion of the waveform of emitted light. For example, the capacitances of the driving capacitors C1 and C2 coincide within the range of ±50% of an average of them. The above phrase of "the driving capacitors C1 and C2 are formed at substantially equidistant positions from the solid-state light-emitting element LD1" means that the driving capacitors C1 and C2 are formed at substantially equidistant positions from the solid-state light-emitting element LD1 within the range not causing the significant distortion of the waveform of emitted light. For example, the distances from the driving capacitors C1 and C2 to the solid-state light-emitting element LD1 coincide within the range of ±50% of an average of them.

Figure 10:
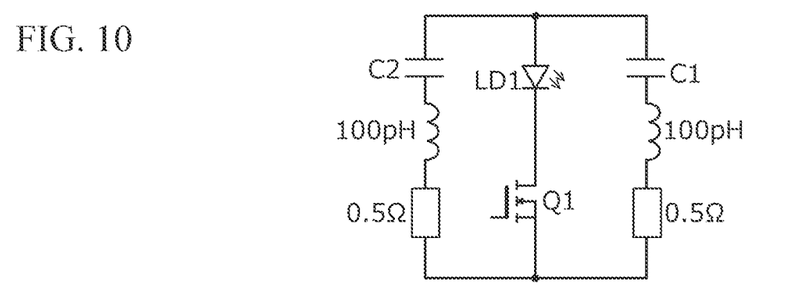
FIG. 10 is a circuit diagram illustrating the parasitic inductance component of 100 pH and the parasitic resistance component of 0.5Ω which are present in a path from the switching element Q1 to a driving capacitor C1 as a parasitic impedance and the parasitic inductance component of 100 pH and the parasitic resistance component of 0.5Ω which are present in a path from the switching element Q1 to a driving capacitor C2 as a parasitic impedance.

Next, the reason why it is desired that the capacitances of the driving capacitors C1 and C2 be within the range of ±50% will be described. FIG. 10 is a circuit diagram illustrating the parasitic inductance component of 100 pH and the parasitic resistance component of 0.5Ω which are present in a path from the switching element Q1 to the driving capacitor C1 as a parasitic impedance and the parasitic inductance component of 100 pH and the parasitic resistance component of 0.5Ω which are present in a path from the switching element Q1 to the driving capacitor C2 as a parasitic impedance. Table 1 represents examples of the amounts of change in the values of the driving capacitors C1 and C2.

TABLE 1

| | C1 (pF) | C2 (pF) | C1 error | C2 error |
|---|---|---|---|---|
| (1) | 700 | 350.0 | 33% | −33% |
| (2) | 700 | 280.0 | 43% | −43% |
| (3) | 700 | 233.1 | 50% | −50% |
| (4) | 700 | 210.0 | 54% | −54% |

Figure 11:
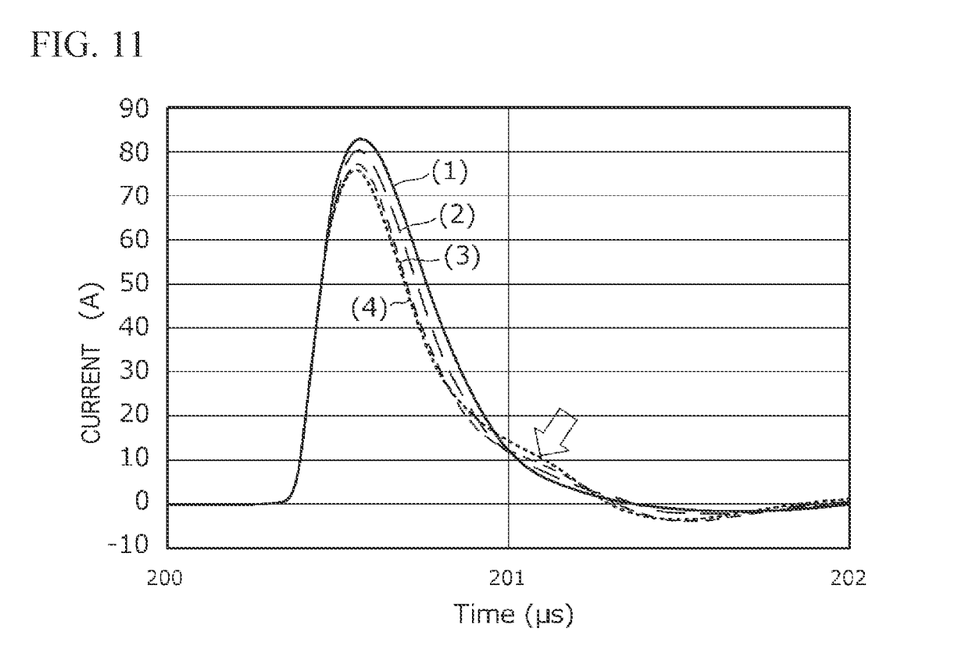
FIG. 11 is a waveform diagram representing that the waveform of a driving current is distorted by the use of the driving capacitors C1 and C2 out of the range of ±50% in a parameter in Table 1.

FIG. 11 is a waveform diagram representing that the waveform of a driving current (a waveform similar to the optical waveform of emitted light of a laser diode LD) is distorted by the use of the driving capacitors C1 and C2 out of the range of ±50% in a parameter in Table 1. In this example, a simulation was conducted using four levels as indicated by Table 1.

Referring to FIG. 11, a rise appears at a shoulder of a waveform (4) represented by an arrow in the case of the driving capacitors C1 and C2 having respective capacitance errors out of the range of ±50%. This rise occurs because of the difference between the time constants of two discharge paths. The occurrence of this rise leads to the reduction in a current peak value. The laser diode LD therefore cannot effectively emit light.

According to the present embodiment in which a silicon substrate is used as the substrate 1 and the upper conductor patterns 6A and 6B are formed several micrometers apart from the lower conductor patterns 8A, 8B, and 8C, the area of current loops formed by the upper conductor patterns 6A and 6B and the lower conductor patterns 8A, 8B, and 8C can be reduced. Accordingly, an equivalent series inductance ESL generated by the current loops can be reduced.

Figure 4:
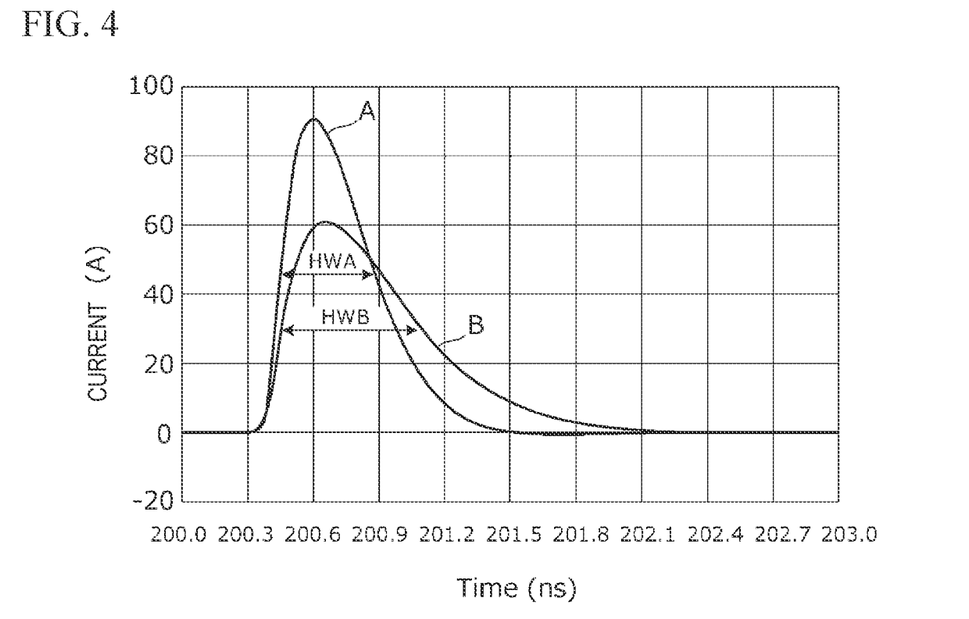

FIG. 4 is a waveform diagram of a driving current (the drain current of the switching element Q1) that flows through the solid-state light-emitting element LD1 when the switching element Q1 is turned on. A waveform A in FIG. 4 is the waveform of the light-emitting device 101 according to the present embodiment, and a waveform B in FIG. 4 is the waveform of a light-emitting device that is a comparative example. This light-emitting device that is a comparative example includes only the driving capacitor C1 illustrated in FIGS. 1, 3A, and 3B as a driving capacitor.

As is apparent from FIG. 4, the peak value of the light-emitting device that is a comparative example is approximately 60 A and the half-width of the light-emitting device is approximately 0.65 ns. The peak value of the light-emitting device 101 according to the present embodiment is approximately 90 A and the half-width of the light-emitting device 101 is approximately 0.4 ns. Thus, in the light-emitting device 101 according to the present embodiment, the emission of short-pulse high-peak light can be achieved.

Since the number of current paths increases in the light-emitting device 101 according to the present embodiment, the capacitance of each of the driving capacitors C1 and C2 decreases and a parasitic impedance per capacitance therefore decreases. Furthermore, in the light-emitting device 101 according to the present embodiment, in addition to a decrease in parasitic impedance, the electric discharge time constants of two closed loops, one of which includes one of the two driving capacitors C1 and C2 and the other one of which includes the other one of the two driving capacitors C1 and C2, are substantially equal. Accordingly, the transient characteristics of a driving current that flows to the solid-state light-emitting element LD1 via the driving capacitor C1 and the transient characteristics of a driving current that flows to the solid-state light-emitting element LD1 via the driving capacitor C2 coincide and the broadening of the pulse widths of the driving currents is suppressed.

In the present disclosure, the phrase of "the respective capacitances of a plurality of capacitors are substantially equal" means that, for example, the capacitances coincide within the range of ±50% of an average of them. The phrase of "the plurality of driving current loops are substantially equivalent" means that, for example, the plurality of driving current loops coincide within the range of ±50% of an average of them. Within this range, the significant distortion of the waveform of emitted light does not occur.

The above exemplary case has been described in which the electric discharge time constants of two closed loops, one of which includes one of the driving capacitors C1 and C2 and the other one of which includes the other one of the driving capacitors C1 and C2, are made substantially equal by making the capacitances of the driving capacitors C1 and C2 substantially equal and making the sizes of the two closed loop substantially equal. However, even when a plurality of driving capacitors have different capacitances, the electric discharge time constants of a plurality of closed loops each including corresponding one of a plurality of driving capacitors may be made substantially equal by setting the respective sizes of the closed loops in consideration of the difference between the capacitances of the capacitors. As a result, a light-emitting device that emits short-pulse high-peak light is provided.

A circuit having a plurality of current loops will be considered. A pulse width Tn of a current flowing through each loop is represented by the following expression where Cn represents the capacitance of a driving capacitor included in the Nth current loop, Ln represents a parasitic inductance, and Rn represents a parasitic resistance.

(Expression 1)

$$Tn = \pi \sqrt{\frac{4L_n^2 C_n}{4L_n - R_n^2 C_n}} \quad (1)$$

The above phrase of "the electric discharge time constants of a plurality of closed loops each including corresponding one of a plurality of driving capacitors are substantially equal" means that the electric discharge time constants of a plurality of closed loops each including corresponding one of a plurality of driving capacitors coincide within the range not causing the significant distortion of the waveform of emitted light. For example, the range is the conditions of Cn, Ln, and Rn under which Tn (n=1, 2, 3) of each of current loops becomes within the range of ±50% of the average of Tn of the current loops. Within this range, the significant distortion of the waveform of emitted light does not occur.

Next, a light-emitting device including three or more driving capacitors will be exemplified. A light-emitting device including the two driving capacitors C1 and C2 illustrated in FIGS. 1 to 4 has been described, but a light-emitting device may include three or more driving capacitors.

Figure 5:
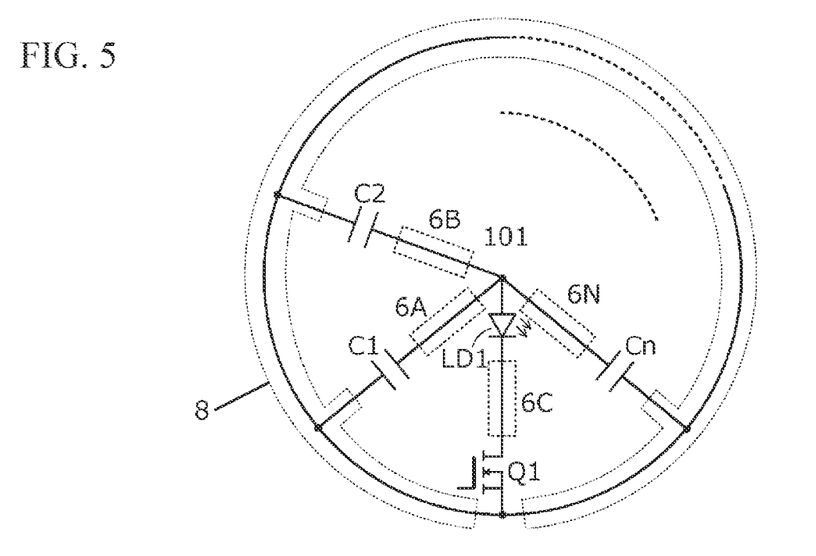
FIG. 5 is a circuit diagram of a light-emitting device including n number of driving capacitors.

FIG. 5 is a circuit diagram of a light-emitting device including n number of driving capacitors. One end (anode) of the solid-state light-emitting element LD1 is connected to one ends of the driving capacitors C1, C2, . . . , and Cn via the upper conductor patterns 6A, 6B, . . . , and 6N, respectively. The respective capacitances of the driving capacitors C1, C2, . . . , and Cn are substantially equal. The driving capacitors C1, C2, . . . , and Cn are formed at substantially equidistant positions from the solid-state light-emitting element LD1.

The above phrase of "the driving capacitors C1, C2, . . . , and Cn are substantially equivalent" means that the capacitances of the driving capacitors C1, C2, . . . , and Cn coincide within the range not causing the significant distortion of the waveform of emitted light. For example, the capacitances of the driving capacitors C1, C2, . . . , and Cn coincide within the range of ±50% of an average of them. The phrase of "the driving capacitors C1, C2, . . . , and Cn are formed at substantially equidistant positions from the solid-state light-emitting element LD1" means that the driving capacitors C1, C2, . . . , and Cn are formed at substantially equidistant positions from the solid-state light-emitting element LD1 within the range not causing the significant distortion of the waveform of emitted light. For example, the distances from the driving capacitors C1, C2, . . . , and Cn to the solid-state light-emitting element LD1 coincide within the range of ±50% of an average of them.

The other ends of the driving capacitors C1, C2, . . . , and Cn are connected to the source of the switching element Q1 via a lower conductor patterns 8. The switching element Q1 and the solid-state light-emitting element LD1 can be disposed close to each other. The driving capacitors C1, C2, . . . , and Cn are formed at substantially equidistant positions from the solid-state light-emitting element LD1, so that the driving capacitors C1, C2, . . . , and Cn are also formed at substantially equidistant positions from the switching element Q1.

The distances from one end (source) of the switching element Q1 to the driving capacitors C1, C2, . . . , and Cn appear uneven in FIG. 5, because the lower conductor patterns 8 is illustrated as a single conductor pattern. However, the distances from the switching element Q1 to the driving capacitors C1, C2, . . . , and Cn are substantially equal as described above. Accordingly, the composite capacitance of the driving capacitors C1, C2, . . . , and Cn becomes large. Furthermore, the transient characteristics of driving currents that flow to the solid-state light-emitting element LD1 via the respective driving capacitors coincide and the broadening of pulse widths of the driving currents is suppressed. Thus, three or more driving capacitors may be provided.

Figure 6A:
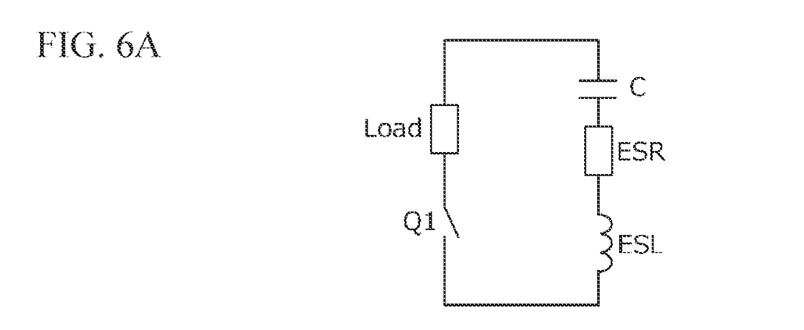
FIG. 6A is an equivalent circuit diagram of the circuit illustrated in FIG. 3A.
Figure 6B:
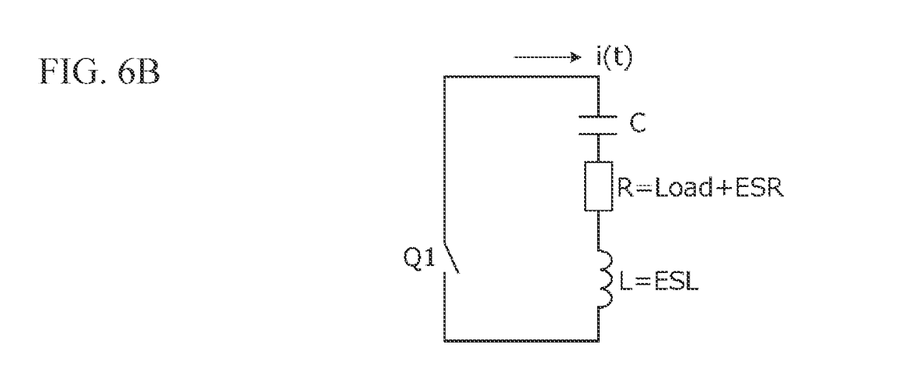
FIG. 6B is a circuit diagram illustrating the equivalent circuit in FIG. 6A in the form of an LCR circuit.

The reason why the decrease in a parasitic impedance leads to the achievement of short-pulse high-peak light will be described. FIG. 6A is an equivalent circuit diagram of the circuit illustrated in FIG. 3A. Referring to FIG. 6A, a capacitor C has the composite capacitance of the driving capacitors C1 and C2, an equivalent series resistance ESR is the resistance components of the parasitic impedances ZpA, ZpB, and ZpC illustrated in FIG. 3B, the equivalent series inductance ESL is the inductance components of the parasitic impedances ZpA, ZpB, and ZpC illustrated in FIG. 3B, and Load corresponds to the resistance component of the solid-state light-emitting element LD1. FIG. 6B is a circuit diagram illustrating the equivalent circuit in FIG. 6A in the form of an LCR circuit. Referring to FIG. 6B, the resistance value of a resistance element R is the composite resistance value of Load and ESR and the inductance of an inductor L is the inductance of ESL.

The state after the switching element Q1 has been turned on can be represented by the following expression (1).

(Expression 2)

$$L\frac{d}{dt}i(t) + Ri(t) + \frac{1}{C}\int i(t)dt = 0 \quad (2)$$

From Expression (2), i(t) is derived. First, the both sides of Expression (2) by t.

(Expression 3)

$$L\frac{d^2}{dt^2}i(t) + R\frac{d}{dt}i(t) + \frac{1}{C}\int i(t) = 0 \quad (3)$$

Solving the second-order differential equation represented by Expression (3) for vibration conditions $((1/LC > R^2/(4L^2))$ yields the following a particular solution.

(Expression 4)

$$i(t) = \frac{V_0}{\omega L}\sin(\omega t)e^{-\frac{R}{2L}t}, \omega = \sqrt{\frac{1}{LC} - \frac{R^2}{4L^2}} \quad (4)$$

Expression (4) includes a sinusoidal element. The half of the period of this sinusoidal wave is a pulse width in this light-emitting device. A pulse width is obtained by the following expression.

(Expression 5)

$$T_{pulse} = \frac{\pi}{\sqrt{\frac{1}{LC} - \frac{R^2}{4L^2}}} = \pi\sqrt{\frac{4L^2C}{4L - R^2C}} \quad (5)$$

As is apparent from Expression (5), there is a monotonically increasing relationship between a pulse width and an inductance L. There is also a monotonically increasing relationship between a pulse width Tpuls and a resistance value R. That is, with the reduction in L or R, a current with a short pulse width can flow. Since the inductance L in Expression (5) corresponds to the equivalent series inductance ESL and the resistance element R in Expression (5) includes ESR that is a parasitic resistance, a pulse width can be shortened by reducing ESR. Since a pulse width and the peak value of a driving current are negatively correlated with each other when the capacitance of the capacitor C and an initial voltage are constant, the pulse width is shortened and the peak value of a driving current is increased by reducing ESR.

Second Embodiment

In the second embodiment, a light-emitting device in which the positional relationship between a plurality of driving capacitors and the solid-state light-emitting element LD1 is different from that illustrated in the first embodiment will be described.

Figure 7:
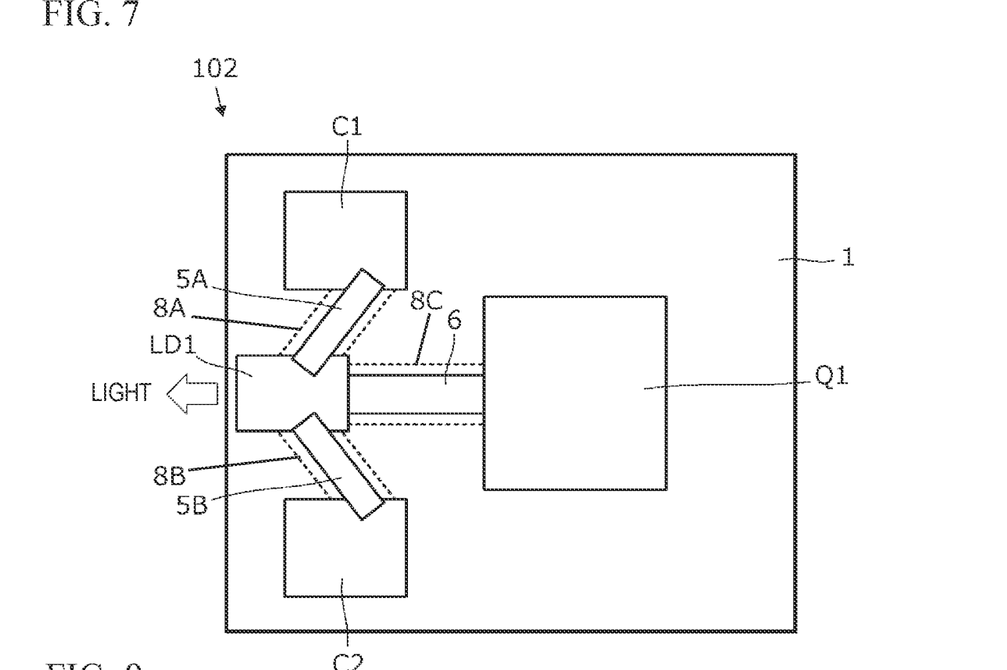
FIG. 7 is a plan view of a light-emitting device according to a second embodiment.

FIG. 7 is a plan view of a light-emitting device according to the second embodiment. A light-emitting device 102 includes the solid-state light-emitting element LD1, the two driving capacitors C1 and C2, and the switching element Q1 which are disposed on/in the substrate 1.

In the lower layer of the substrate 1, the lower conductor patterns 8A, 8B, and 8C are formed. An interlayer connection conductor is disposed between the end portion of the lower conductor pattern 8A and the lower-surface electrode of the driving capacitor C1, and an interlayer connection conductor is disposed between the end portion of the lower conductor pattern 8B and the lower-surface electrode of the driving capacitor C2. Accordingly, the lower-surface electrode of the driving capacitor C1 is connected to the end portion of the lower conductor pattern 8A, and the lower-surface electrode of the driving capacitor C2 is connected to the end portion of the lower conductor pattern 8B. The end portion of the lower conductor pattern 8C is connected to the source electrode of the switching element Q1.

An upper conductor pattern 6 is formed on the upper surface of the substrate 1. A first end of the upper conductor pattern 6 is connected to the cathode electrode of the solid-state light-emitting element LD1. A second end of the upper conductor pattern 6 is connected to the drain of the switching element Q1.

The upper-surface electrode of the driving capacitor C1 and the upper-surface electrode (anode electrode) of the solid-state light-emitting element LD1 are connected via a wire 5A, and the upper-surface electrode of the driving capacitor C2 and the upper-surface electrode (anode electrode) of the solid-state light-emitting element LD1 are connected via a wire 5B.

With the conductor patterns in two layers as above, the area of the driving current loops of the solid-state light-emitting element LD1 can be reduced as much as possible and a magnetic flux cancellation effect (=the reduction in a parasitic inductance) can be maximized.

Third Embodiment

In the third embodiment, some examples of the positional relationship between a plurality of driving capacitors and the solid-state light-emitting element LD1 will be described.

Figure 8:
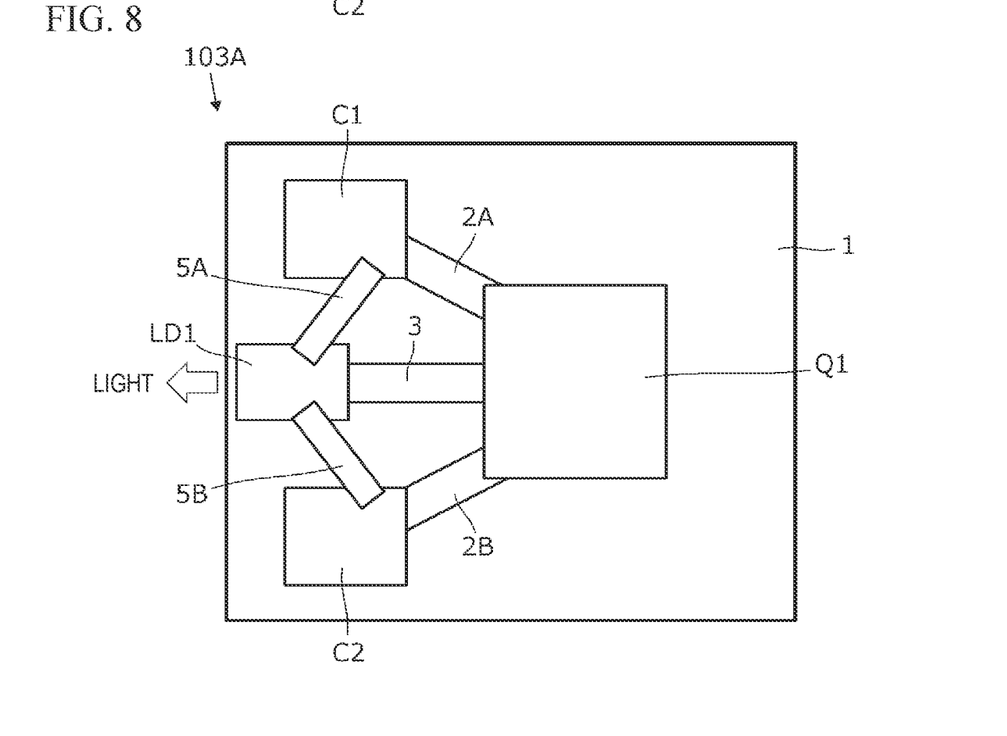
FIG. 8 is a plan view of a light-emitting device 103A according to a third embodiment.

FIG. 8 is a plan view of a light-emitting device 103A according to the third embodiment. The light-emitting device 103A includes the solid-state light-emitting element LD1 and the two driving capacitors C1 and C2, and the switching element Q1 which are disposed on/in the substrate 1.

In the surface layer of the substrate 1, conductor patterns 2A, 2B, and 3 are formed. The driving capacitor C1 is disposed at the first end of the conductor pattern 2A, and the driving capacitor C2 is disposed at the first end of the conductor pattern 2B. Accordingly, the lower-surface electrode of the driving capacitor C1 is connected to the first end of the conductor pattern 2A, and the lower-surface electrode of the driving capacitor C2 is connected to the first end of the conductor pattern 2B.

The solid-state light-emitting element LD1 is disposed at the first end of the conductor pattern 3. The first end of the solid-state light-emitting element LD1 and one end (drain terminal) of the switching element Q1 are connected via the conductor pattern 3. The switching element Q1 is disposed at the second ends of the conductor patterns 2A and 2B and the second end of the conductor pattern 3. The respective second ends of the conductor patterns 2A and 2B are connected to one end (source terminal) of the switching element Q1.

The upper-surface electrode of the driving capacitor C1 and the upper-surface electrode of the solid-state light-emitting element LD1 are connected via the wire 5A, and the upper-surface electrode of the driving capacitor C2 and the upper-surface electrode of the solid-state light-emitting element LD1 are connected via the wire 5B. The capacitances of the driving capacitors C1 and C2 are substantially equal. The driving capacitors C1 and C2 are formed at substantially equidistant positions from the solid-state light-emitting element LD1.

The driving capacitors C1 and C2 are connected in parallel to each other and store driving electric charges for the solid-state light-emitting element LD1. A driving current loop is formed by the driving capacitor C1, the solid-state light-emitting element LD1, and the switching element Q1. A driving current loop is formed by the driving capacitor C2, the solid-state light-emitting element LD1, and the switching element Q1.

Like in the light-emitting device 103A, conductor patterns may be formed only in the surface layer of a substrate.

Figure 9:
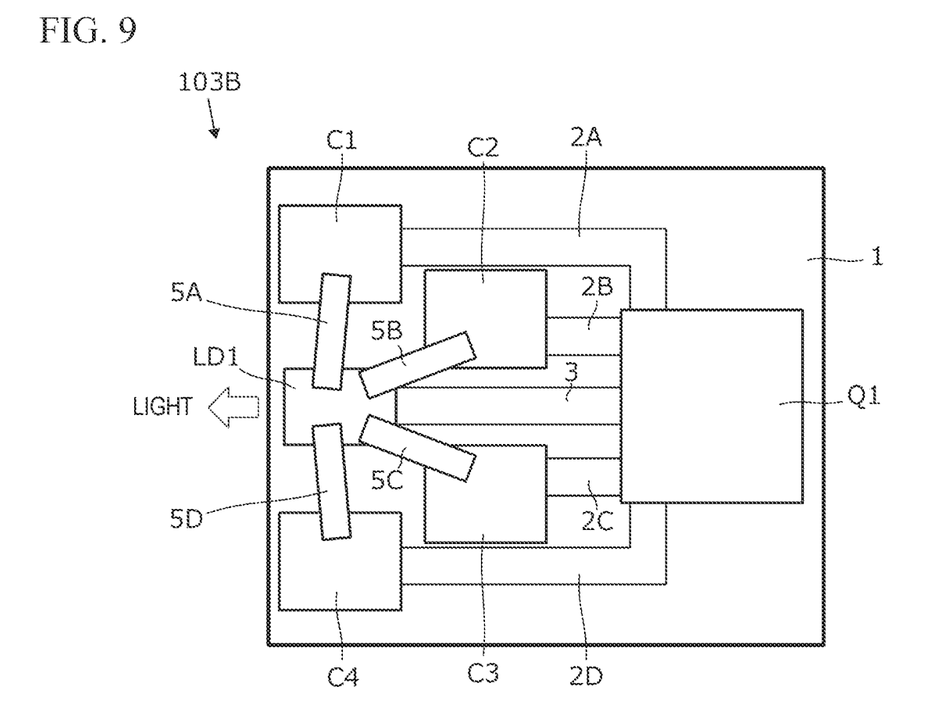
FIG. 9 is a plan view of another light-emitting device 103B according to the third embodiment.

FIG. 9 is a plan view of another light-emitting device 103B according to the third embodiment. The light-emitting device 103B includes the solid-state light-emitting element LD1, four driving capacitors C1, C2, C3, and C4, and the switching element Q1 which are disposed on/in the substrate 1.

In the surface layer of the substrate 1, conductor patterns 2A, 2B, 2C, 2D, and 3 are formed. The driving capacitors C1, C2, C3, and C4 are disposed at the first ends of the conductor patterns 2A, 2B, 2C, and 2D, respectively. Accordingly, the lower-surface electrodes of the driving capacitors C1, C2, C3, and C4 are connected to the first ends of the conductor patterns 2A, 2B, 2C, and 2D, respectively.

The solid-state light-emitting element LD1 is disposed at the first end of the conductor pattern 3. The first end of the solid-state light-emitting element LD1 and one end (drain terminal) of the switching element Q1 are connected via the conductor pattern 3. The respective second ends of the conductor patterns 2A, 2B, 2C, and 2D are connected to one end (source terminal) of the switching element Q1.

The upper-surface electrodes of the driving capacitors C1, C2, C3, and C4 are connected to the upper-surface electrode of the solid-state light-emitting element LD1 via wires 5A, 5B, 5C, and 5D, respectively.

The driving capacitors C1, C2, C3, and C4 are connected in parallel to each other and store driving electric charges for the solid-state light-emitting element LD1. A driving current loop is formed by the driving capacitor C1, the solid-state light-emitting element LD1, and the switching element Q1. A driving current loop is formed by the driving capacitor C2, the solid-state light-emitting element LD1, and the switching element Q1. A driving current loop is formed by the driving capacitor C3, the solid-state light-emitting element LD1, and the switching element Q1. A driving current loop is formed by the driving capacitor C4, the solid-state light-emitting element LD1, and the switching element Q1.

The capacitances of the driving capacitors C1, C2, C3, and C4 are substantially equal. The driving capacitors C1, C2, C3, and C4 are formed at substantially equidistant positions from the solid-state light-emitting element LD1. Accordingly, the wire 5A connecting the solid-state light-emitting element LD1 and the driving capacitor C1, the wire 5B connecting the solid-state light-emitting element LD1 and the driving capacitor C2, the wire 5C connecting the solid-state light-emitting element LD1 and the driving capacitor C3, and the wire 5D connecting the solid-state light-emitting element LD1 and the driving capacitor C4 are substantially equal in length and have a substantially equal parasitic impedance. In this example, since the switching element Q1 and the solid-state light-emitting element LD1 are comparatively apart from each other, the distance between the switching element Q1 and each of the driving capacitors C1 and C4 and the distance between the switching element Q1 and each of the driving capacitors C2 and C3 are different. However, since the line width of the lower conductor pattern 8 can be easily increased, the parasitic impedances of them can be relatively reduced. Accordingly, the electric discharge time constants of closed loops including the respective driving capacitors can coincide.

Lastly, the present disclosure is not limited to the above-described embodiments. A modification and a change can be made as appropriate by those skilled in the art. The scope of the present disclosure is not defined by the above-described embodiments but by the appended claims. Furthermore, the scope of the present disclosure includes modifications and changes from the embodiments within the scopes of the claims and the scopes of equivalents.

For example, the present disclosure may be applicable to not only a laser diode bus also a solid-state light-emitting element, such as a light-emitting diode or an organic EL.

A light-emitting device includes the single solid-state light-emitting element LD1 in the above example, but may include a plurality of solid-state light-emitting elements.

A light-emitting device includes separate chip driving capacitors in the above example, but may include, on/in a substrate, a driving capacitor formed of the dielectric layer of the substrate and electrodes facing each other across the dielectric layer.

A light-emitting device includes the single switching element Q1 disposed on the substrate in the above example, but may include a switching element formed in a part of a semiconductor substrate.

A light-emitting device includes the solid-state light-emitting element LD1 disposed on the substrate in the above example, but may include a solid-state light-emitting element formed in a part of a semiconductor substrate.

REFERENCE SIGNS LIST

C capacitor
C1, C2, C3, and C4 driving capacitor
E1 constant voltage power supply
ESL equivalent series inductance
ESR equivalent series resistance
L inductor
LD1 solid-state light-emitting element
Q1 switching element
R and R1 resistance element
ZpA, ZpB, and ZpC parasitic impedance
1 substrate
2A, 2B, 2C, and 2D conductor pattern
3 conductor pattern
4A and 4B light-emitting element connection conductor
5A, 5B, 5C, and 5D wire
6, 6A, 6B, and 6C upper conductor pattern
7 interlayer connection conductor
8, 8A, 8B, and 8C lower conductor patterns
10 capacitor
11 and 12 outer electrode
20 solid-state light-emitting element
30 semiconductor switching element
32 connecting electrode
100, 101, 102, 103A, and 103B light-emitting device

The invention claimed is:

1. A light-emitting device comprising:
a solid-state light-emitting element;
a plurality of driving capacitors; and
a switch,
wherein the solid-state light-emitting element, the plurality of driving capacitors, and the switch, are on or in a substrate,
wherein, when the switch is turned on, the switch is configured to discharge a charged electric charge of the plurality of driving capacitors to the solid-state light-emitting element through a plurality of driving current loops, wherein the plurality of driving capacitors comprises a plurality of capacitors that are configured to store a driving electric charge for the solid-state light-emitting element and that are connected in parallel, wherein each of the plurality of capacitors, the solid-state light-emitting element, and the switch form the plurality of driving current loops, and wherein time constants of a plurality of discharge paths formed by the plurality of capacitors and the plurality of driving current loops coincide.

2. The light-emitting device according to claim 1, wherein when the time constants coincide, a light emitting pulse width of the solid-state light-emitting element is narrower than the light emitting pulse width of the solid-state light-emitting element when a single capacitor is a driving capacitor.

3. The light-emitting device according to claim 1, wherein time constants of the plurality of discharge paths coincide within a range of ±50% of an average of the time constants.

4. The light-emitting device according to claim 1,
wherein capacitances of the plurality of capacitors are substantially equal, and
wherein the plurality of driving current loops are substantially equivalent.

5. The light-emitting device according to claim 4,
wherein capacitances of the plurality of capacitors coincide within a range of ±50% of an average of the capacitances, and
wherein distances from the plurality of capacitors to the solid-state light-emitting element coincide within a range of ±50% of an average of the distances.

6. The light-emitting device according to claim 1, wherein the plurality of capacitors do not overlap the solid-state light-emitting element and the switch in a plan view of the light-emitting device.

7. The light-emitting device according to claim 1,
wherein the substrate comprises an upper conductor pattern and a lower conductor pattern, and
wherein a first end of the switch and a first end of the solid-state light-emitting element are connected to the upper conductor pattern, a second end of the switch is connected to the lower conductor pattern, and the plurality of capacitors are connected between the upper conductor pattern and the lower conductor pattern.

8. The light-emitting device according to claim 1, further comprising:
a first conductor pattern connecting a first end of the solid-state light-emitting element and a first end of a first of the plurality of capacitors of the plurality of driving capacitors; and
a second conductor pattern connecting the first end of the solid-state light-emitting element and a first end of a second of the plurality of capacitors of the plurality of driving capacitors,
wherein the first and second conductor patterns are substantially equal in length.

9. The light-emitting device according to claim 8, further comprising:
a third conductor pattern connecting a second end of the solid-state light-emitting element and a second end of the first of the plurality of capacitors of the plurality of driving capacitors; and
a fourth conductor pattern connecting the second end of the solid-state light-emitting element and a second end of the second of the plurality of capacitors of the plurality of driving capacitors,
wherein the third and fourth conductor patterns are substantially equal in length.

* * * * *